United States Patent [19]

Wootton

[11] 4,135,130
[45] Jan. 16, 1979

[54] METHOD OF TESTING GAS INSULATED SYSTEMS FOR THE PRESENCE OF CONDUCTING PARTICLES UTILIZING A GAS MIXTURE OF NITROGEN AND SULFUR HEXAFLUORIDE

[75] Inventor: Roy E. Wootton, Murrysville, Pa.

[73] Assignee: The United States of America as represented by the United States Department of Energy, Washington, D.C.

[21] Appl. No.: 811,230

[22] Filed: Jun. 29, 1977

[51] Int. Cl.² .................. G01R 31/12; G01R 31/00; C01B 2/00
[52] U.S. Cl. ........................... 324/54; 174/17 GF; 174/25 G; 252/372
[58] Field of Search ............... 324/54; 174/14 R, 28, 174/17 GF, 25 G, 26 G; 252/372

[56] References Cited

U.S. PATENT DOCUMENTS

| | | | |
|---|---|---|---|
| 2,853,540 | 9/1958 | Camilli et al. | 174/17 GF |
| 3,281,521 | 10/1966 | Wilson | 174/17 GF |
| 3,515,939 | 6/1970 | Trump | 174/14 R X |
| 3,792,188 | 2/1974 | Cronin | 174/14 R X |

OTHER PUBLICATIONS

Mulcahy et al., *A Review of Insulation Breakdown and Switching in Gas Insulation*, Insulation/Circuits, Aug. 1970, pp. 55-61.

*Primary Examiner*—Gerard R. Strecker
*Attorney, Agent, or Firm*—Dean E. Carlson; Frank H. Jackson; Robert J. Fisher

[57] ABSTRACT

A method of testing a gas insulated system for the presence of conducting particles. The method includes inserting a gaseous mixture comprising about 98 volume percent nitrogen and about 2 volume percent sulfur hexafluoride into the gas insulated system at a pressure greater than 60 lb./sq. in. gauge, and then applying a test voltage to the system. If particles are present within the system, the gaseous mixture will break down, providing an indicator of the presence of the particles.

6 Claims, 2 Drawing Figures

METHOD OF TESTING GAS INSULATED SYSTEMS FOR THE PRESENCE OF CONDUCTING PARTICLES UTILIZING A GAS MIXTURE OF NITROGEN AND SULFUR HEXAFLUORIDE

BACKGROUND OF THE INVENTION

This invention relates generally to gas insulated systems and more particularly to a method for testing a gas insulated system for the presence of conducting particles therein.

Compressed electronegative and other gases and mixtures are becoming an increasingly common medium for insulating high voltage equipment of many different kinds. One application is in compressed-gas filled coaxial cables for power transmission and gas-insulated compact substations. Gas-filled capacitance standards for power factor measurement, insulation in air-borne equipment, insulation in high-voltage circuit breakers, and gas-insulated power transformers are among other applications. The advantage of using gas in these applications varies according to the application. For example, in transformers the substitution of gas for oil avoids a fire hazard, while in substations and transmission lines the substitution of gas in place of air results in much more compact equipment.

A well-known problem in compressed gas insulated equipment is associated with the presence of free conducting or semiconducting particles which can initiate flashovers in the gas. While in theory it would be possible to assemble equipment in a clean room, and systems commonly include particle trapping means or other methods of neutralizing the effects of particles, there is still a possibility of the introduction of particles during assembly or, for example, their generation by the movement of sliding joints due to thermal expansion during operation. Therefore, gas-insulated systems have a high probability of containing harmful particles, and field testing by the application of voltage after assembly on site is an important part of the acceptance testing procedure.

Testing of large systems with power frequency voltage requires substantial reactive power, and this power requirement increases with the square of the testing voltage. For example, the test at 200 kV rms, 60 Hz, on a cable having a capacitance of 20 microfarads/foot requires approximately 300 volt amperes/foot or over 1.6 megavolt amperes/mile. Power supplies able to deliver reactive powers of this magnitude are large, expensive, and not easily transportable. A typical cost for a resonant test set may be in the $100,000 to $200,000 range. There is therefore a great incentive to find methods of testing which require less reactive power.

Direct current, or DC, testing enables a peak voltage equal to the peak working 60 Hz voltage to be applied to the system with virtually zero reactive power and very low real power requirements. The test equipment is comparatively compact and easily transported. It is the standard method of testing non-gas-insulated high-voltage cables, and some gas-insulated power transmission systems have also been tested in this way. However, tests have shown that the conducting particles which lead to breakdown move much more readily and at higher speeds with DC compared with alternating current, or AC, voltages. In addition to differences in the movement and breakdown behavior, DC may cause particles to move to, and adhere to, insulators where they may be more harmful when AC or impulse voltages are later applied than they would have been if the particles had been left in their original positions. Unless specially designed, particle traps are also less likely to be effective with DC than AC, so that although the particles are readily moved by the DC, there is a lesser probability that they will be trapped. For these reasons, DC testing is not in favor at the present time.

Other methods which have been suggested include utilizing surge generators or low frequency AC, air or nitrogen in place of the commonly used sulfur hexafluoride (SF$_6$) or utilizing SF$_6$ at a lower pressure than at normal operating conditions. One disadvantage of the use of lower pressures is that particles shows a tendency to weld or stick perpendicular to the electrode, and may subsequently cause breakdown. Thus, a high gas pressure equal to or above the normal working pressure is to be preferred.

SUMMARY OF THE INVENTION

The aforementioned disadvantage in the prior art is alleviated by this invention by providing a method for testing gas insulated systems for the presence of conducting particles while minimizing the power requirements for the test. The method comprises inserting a gaseous mixture comprising about 98 volume percent nitrogen and about 2 volume percent sulfur hexafluoride into the gas insulated system at a pressure greater than 60 lbs./sq. in. gauge, and then applying a test voltage to the system.

BRIEF DESCRIPTION OF THE DRAWINGS

Reference is now made to the description of the preferred embodiment, illustrated in the accompanying drawings, in which.

DESCRIPTION OF THE PREFERRED EMBODIMENT

Figure 1:
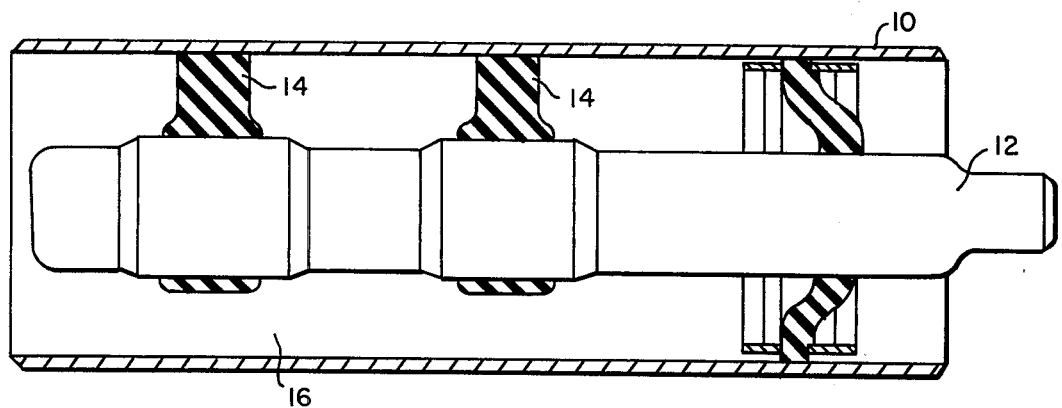
FIG. 1 is an elevational view of a typical gas insulated transmission line.

Referring now to FIG. 1, therein is illustrated a typical gas-insulated transmission line, exemplary of the type of gas insulated systems upon which the method of this invention may be utilized. The transmission line comprises an elongated, cylindrical outer sheath 10, a cylindrical, elongated inner conductor 12 disposed within the outer sheath 10, and insulating spacers 14 for insulatably supporting the inner conductor 12 within the outer sheath 10. During normal operations, the interior of the outer sheath 10 is filled with an electrically insulating gas 16 typical of which is sulfur hexafluoride at a pressure of 45-60 pounds per square inch gauge. Conducting or semiconducting particles (not shown) which may be present within the outer sheath 10 may cause breakdown of the dielectric gas 16 during operation of the transmission line, and therefore it is desirable to test the transmission line for the presence of mobile conducting or semiconducting particles.

Figure 2:
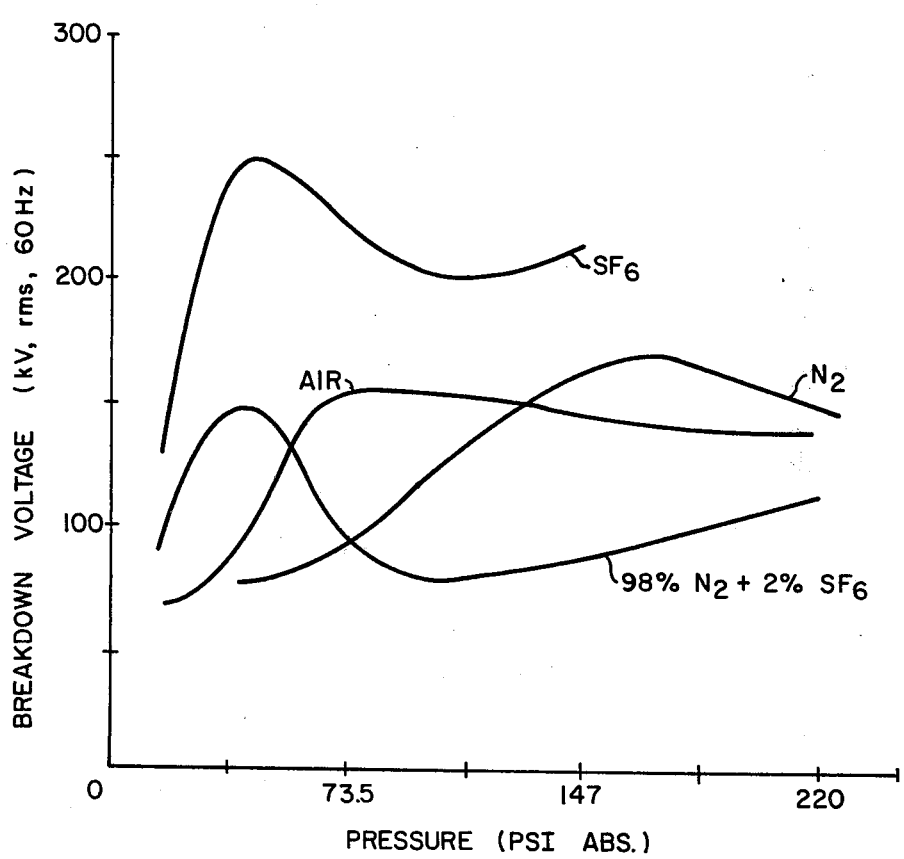
FIG. 2 is a graph illustrating the breakdown characteristics of various gases in a uniform field.

Referring now to FIG. 2, therein is shown the breakdown characteristics of various gases, namely sulfur hexafluoride, nitrogen, air, and a gaseous mixture of 98% nitrogen and 2% of sulfur hexafluoride by volume. The curves are based on data obtained during experimentation utilizing 0.018 inch diameter copper wires one-fourth-inch long in a 3-inch plane gap. Additional experiments made with like aluminum wires achieve similar results. It can be seen, in the presence of particles, that at low pressures an increase in sulfur hexafluoride pressure leads to an increase in breakdown strength up to a pressure of about 44 lbs./sq. in. absolute. Beyond that point, increases in pressure result in a decrease in dielectric strength until very high pressures over approximately 100 lbs./sq. in. absolute are reached. This dependence on pressure is quite different from that for sulfur hexafluoride in the absence of conducting particles. In the absence of particles, the dielectric strength of sulfur hexafluoride increases with increasing pressure, and the breakdown strength is higher than that found in the presence of particles.

The characteristic for nitrogen with similar one-fourth-inch particles is also shown in FIG. 2, and it may be seen that the breakdown voltage for nitrogen is lower over the entire pressure range than for sulfur hexafluoride at the same pressure. This is likewise true for air, and thus air or nitrogen would both require less reactive power than sulfur hexafluoride at the same pressure before breakdown would be initiated in power testing.

However, it can be seen that the gaseous mixture of 98 volume percent nitrogen and 2 volume percent sulfur hexafluoride surprisingly shows the strength at pressures above 73.5 lbs./sq. in. absolute to be lower than that for sulfur hexafluoride, nitrogen, or air. This lower strength is only found in the presence of particles, and the same mixture of 98% nitrogen and 2% sulfur hexafluoride exhibits a higher dielectric strength when tested between plane parallel electrodes without particles than does a 100% nitrogen gas. However, in the presence of particles, it exhibits a markedly lower strength as illustrated in FIG. 2. This discovery of the markedly lower strength of the gaseous mixture is particularly useful for testing purposes. As can be seen, at pressures above 73.5 psia the gaseous mixture has a lower strength, or breaks down at lower voltages, than either sulfur hexafluoride, nitrogen, or air. Thus, this gaseous mixture may be utilized to test gas insulated systems for the presence of conducting particles at pressures greater than that normally encountered in the gas systems, for are typically 45 lbs./sq. in. gauge, and the testing can occur at lower voltage levels.

The testing of the gas-insulated system, which in this embodiment is a gas-insulated transmission line, occurs as follows. The gaseous mixture of 98 volume percent nitrogen and 2 volume percent sulfur hexafluoride is inserted into the gas insulated system at a pressure greater than 60 lbs./sq. in. gauge, and then the test voltage is applied to the system. If there are particles present within the system, they will spark upon application of the test voltage, thereby indicating the presence of particles within the system. Although pressures greater than 60 lbs./sq. in. gauge may be utilized, the preferred range is from 60 to 180 lbs./sq. in. gauge, and the most advantageous testing may occur when the gas is inserted at a pressure within the range of 60 to 100 lbs./sq. in. gauge. The test voltage applied to the system need have a rms 60 Hz magnitude less than 150 kV for the herein described system, as the gaseous mixture breaks down at less than this voltage, and if utilized at the recommended pressure of 60 to 100 lbs./sq. in. gauge, the alternating current voltage rms magnitude can be less than 100 kV. Of course, the voltages required are dependent on the physical dimensions of the coaxial system to be tested.

Therefore, what has been described is a method of testing gas-insulated systems for the presence of particles by utilizing a particle-susceptible gas within the system and then applying a test voltage to the system. The gas utilized in the method is not a weak dielectric in the absence of particles, but rather is a gas which, at high pressure in the absence of particles, is relatively strong but which, in the presence of particles, is particularly weak. The use of this gaseous mixture not only decreases the cost involved in testing the system by lowering the magnitude of test voltages required to test the system, but also has economic advantages in that there is only 2% of the more expensive sulfur hexafluoride gas and 98% of the relatively cheaper nitrogen.

I claim as my invention:

1. A method of testing a gas-insulated system for the presence of conducting particles comprising:
    inserting a gaseous mixture comprising about 98 volume percent nitrogen and about 2 volume percent sulfur hexafluoride into said system at a pressure greater than 60 lbs./sq. in. gauge; and
    applying a test voltage to said system insufficient to cause break-down of the gaseous mixture in the absence of conducting particles, whereby the presence of conducting particles will be indicated by the breakdown of said gaseous mixture.

2. The method according to claim 1 wherein said test voltage is an alternating current voltage having a rms magnitude less than 150 kV.

3. The method according to claim 1 wherein said gaseous mixture is inserted at a pressure within the range of 60 to 180 lbs./sq. in. gauge.

4. The method according to claim 3 wherein said pressure range is 60 to 100 lbs./sq. in. gauge.

5. The method according to claim 4 wherein said test voltage is an alternating current voltage having a rms magnitude less than 100 kV.

6. The method according to claim 1 wherein said gas insulated system comprises a compressed gas insulated transmission line.

* * * * *